US006885852B2

United States Patent
Hughes et al.

(10) Patent No.: US 6,885,852 B2
(45) Date of Patent: Apr. 26, 2005

(54) METHOD AND APPARATUS IN A WIRELESS COMMUNICATION DEVICE FOR MITIGATING A RECEIVED POWER OVERLOAD

(75) Inventors: James David Hughes, Boynton Beach, FL (US); Lynn R. Freytag, Deerfield Beach, FL (US); John Richard Oakley, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 492 days.

(21) Appl. No.: 10/137,754

(22) Filed: May 2, 2002

(65) Prior Publication Data

US 2003/0207676 A1 Nov. 6, 2003

(51) Int. Cl.$^7$ .................................................. H04B 1/06
(52) U.S. Cl. ............................... 455/234.1; 455/232.1; 455/250.1
(58) Field of Search .......................... 455/232.1, 234.1, 455/250.1, 257, 258, 239.1, 240.1, 244.1; 375/345

(56) References Cited

U.S. PATENT DOCUMENTS

| 5,563,916 | A | * | 10/1996 | Scarpa ..................... 455/234.1 |
| 5,742,899 | A | * | 4/1998 | Blackburn et al. ........ 455/234.2 |
| 5,917,865 | A | * | 6/1999 | Kopmeiners et al. ..... 455/239.1 |
| 6,670,901 | B1 | * | 12/2003 | Brueske et al. .......... 455/232.1 |

* cited by examiner

*Primary Examiner*—Edward F. Urban
*Assistant Examiner*—Lana Le
(74) *Attorney, Agent, or Firm*—Posz & Bethards, PLC; Charles W. Bethards

(57) ABSTRACT

A power measurement element (106) measures (302) the wide-band received signal power of a receiver (102), and a wide-band AGC system (108) transfers (306) receiver gain control from an on-channel AGC system (110) to the wide-band AGC system, when the wide-band received signal power exceeds a pre-programmed threshold for longer than a pre-programmed delay time. The wide-band AGC system is arranged and programmed to decrease (308) a front-end gain of the receiver through a plurality of gain steps of a pre-programmed size (208) applied at a pre-programmed rate until the received wide-band signal power falls below the pre-programmed threshold.

18 Claims, 2 Drawing Sheets

METHOD AND APPARATUS IN A WIRELESS COMMUNICATION DEVICE FOR MITIGATING A RECEIVED POWER OVERLOAD

FIELD OF THE INVENTION

This invention relates in general to wireless communication systems, and more specifically to a method and apparatus in a wireless communication device for mitigating a received power overload.

BACKGROUND OF THE INVENTION

A portable wireless communication receiver operates over a wide range of signal strengths and thus generally has some form of automatic gain control (AGC) system. Typical on-channel AGC systems are good at tracking slowly changing signal strength, but tend to be too slow for tracking sudden, large increases in signal strength, such as can occur during channel scanning. Such changes can temporarily saturate the mixers or baseband filters of the receiver, causing channel reception to be impaired until the on-channel AGC can recover.

One prior-art receiver attempted to solve the problem by adding a single, predetermined loss to the receiver front end in response to a sudden increase in wide-band energy. This approach, however, ultimately could not be used, because it made the receiver unstable under some signal conditions.

Thus, what is needed is a method and apparatus for mitigating a received power overload. The method and apparatus preferably will be able to respond quickly to a sudden, large increase in signal strength, such as can occur during channel scanning, without causing the receiver to become unstable.

DETAILED DESCRIPTION

Figure 1:
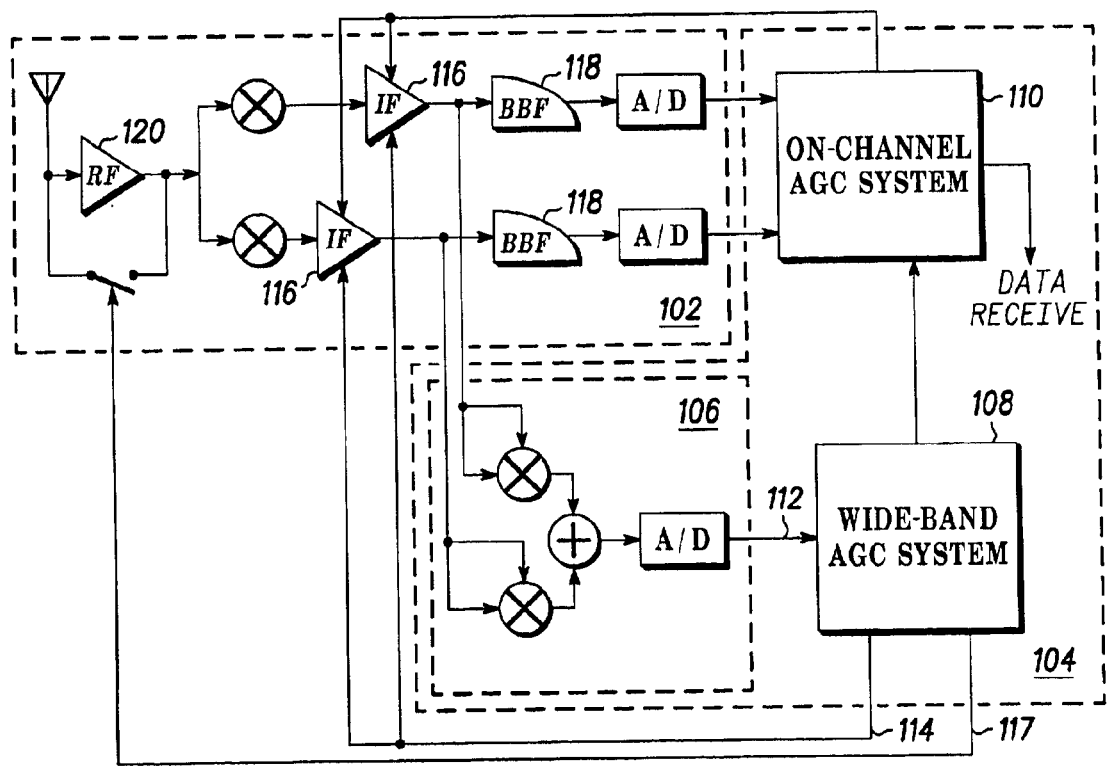
FIG. 1 is an electrical block diagram of an exemplary wireless communication device in accordance with the present invention.

Referring to FIG. 1, an electrical block diagram of an exemplary wireless communication device 100 in accordance with the present invention comprises a conventional receiver 102 for receiving a wireless communication signal, and an apparatus 104 coupled to the receiver 102 for mitigating a received power overload by transferring control of a receiver gain from an on-channel AGC system 110 to a wide-band AGC system 108, in response to a large increase in a wide-band received signal power, in accordance with the present invention. The apparatus 104 comprises a power measurement element 106 for measuring a wide-band received signal power, preferably at a point after the intermediate frequency (IF) amplifiers 116 and before the baseband filters 118 of the receiver 102. An advantage of measuring wide-band power at this point is that it allows a much faster measurement and response than is attainable by the slower on-channel AGC system 110. The power measurement element 106 is preferably a conventional analog sum-of-squares detector, followed by a conventional A/D converter having an output 112. It will be appreciated that additional filters (not shown, but well known to one of ordinary skill in the art) can be desirable in the power measurement element 106, e.g., for removing DC offset and A/D chatter. It will be further appreciated that, alternatively, other well-known types of power measurement detectors can be utilized as well.

The apparatus 104 further comprises the on-channel AGC system 110, coupled to the wide-band AGC system 108 for cooperating therewith to control the receiver gain. The apparatus also includes the wide-band AGC system 108, coupled to the power measurement element 106 for transferring receiver gain control from the on-channel AGC system 110 to the wide-band AGC system 108, when the wide-band received signal power exceeds a pre-programmed threshold (e.g., 6 dB below the saturation level of the receiver 102) for longer than a pre-programmed delay time. The wide-band AGC system 108 is preferably coupled to the IF amplifiers 116 of the receiver 102 through a continuously variable gain control line 114, as well as to the RF amplifier 120 through a switched discrete gain control line 117. It will be appreciated that, alternatively, other well-known gain control arrangements can be utilized in accordance with the present invention.

The wide-band AGC system 108 preferably is arranged and programmed to decrease the front-end gain of the receiver through a plurality of gain steps of a pre-programmed size (e.g., 3 dB) applied at a pre-programmed rate until the received wide-band signal power falls below the pre-programmed threshold. The pre-programmed rate preferably is substantially faster (e.g., ten to twenty times faster) than the AGC update rate (e.g., one update every 55 microseconds) of the on-channel AGC system 110, so that the wide-band AGC system 108 can quickly mitigate the power overload.

When the received wide-band signal power falls below the pre-programmed threshold, or when the front-end gain reaches a predetermined minimum value, the wide-band AGC system 108 preferably stops decreasing the front-end gain and enters a "follow-up" mode for a pre-programmed follow-up time period (e.g., nominally two (2) milliseconds). While in the follow-up mode, the wide-band AGC system 108 is further arranged and programmed to cooperate with the on-channel AGC system 110 to return receiver gain control to the on-channel AGC system 110, and to limit, during the pre-programmed follow-up time period, changes in the front end gain of the receiver by the on-channel AGC system 110 to a pre-programmed maximum gain change (e.g., 6 dB) per AGC update. This advantageously prevents the more-slowly-responding on-channel AGC system 110 from putting the wireless communication device 100 back into a high-gain position too quickly, which could cause the device 100 to switch between high and low gain positions in an unstable, oscillatory manner. In addition, the wide-band AGC system 108 preferably sets the delay time to a first pre-programmed value (e.g., 1.5 microseconds) during the follow-up time period, and sets the delay time to a second pre-programmed value (e.g., 5 microseconds) at times outside of the follow-up time period. The delay time during the follow-up period advantageously provides further protection against instability by decreasing the likelihood of a transfer of receiver gain control back to the wide-band AGC system soon after a preceding transfer has ended.

The above-discussed pre-programmed parameters, including the pre-programmed threshold, the pre-programmed size of the gain steps, the pre-programmed rate of applying the gain steps, the pre-programmed follow-up time period, the pre-programmed maximum gain change per AGC update, and the first and second pre-programmed values for the delay time preferably are programmed at the time of manufacture of the wireless communication device. It will be appreciated that, alternatively, some or all of the pre-programmed parameters can be programmed or reprogrammed in the field, as well. It will be further appreciated that the wide-band AGC system 108 and the on-channel AGC system 110 can be realized in a conventional digital signal processor (DSP) using software that can be readily prepared by one of ordinary skill in the art, given the teachings of the present disclosure. Alternatively, the wide-band and on-channel AGC systems 108, 110 can be realized as custom integrated circuits, as well.

Figure 2:
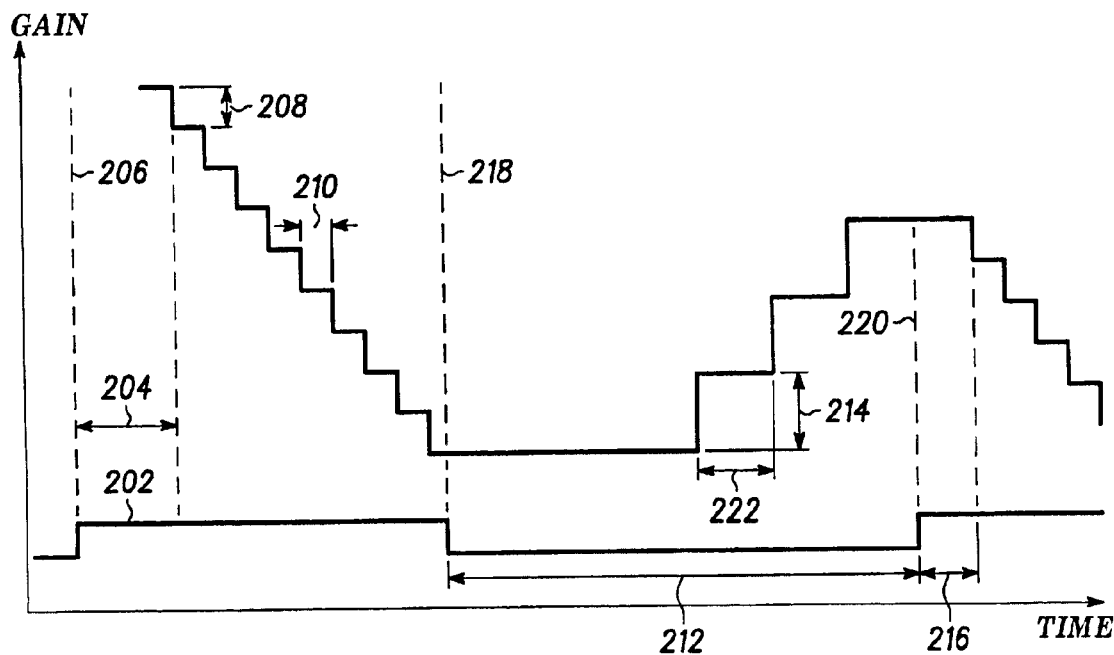
FIG. 2 is a diagram depicting operation of the exemplary wireless communication device in accordance with the present invention.

Referring to FIG. 2, a diagram 200 (not to scale) depicts operation of the apparatus 104 in accordance with the present invention. The diagram 200 is a simulated plot of receiver front-end gain versus time, in response to a received power overload. Also depicted is a digital alert signal 202 at the output 112 of the power measurement element 106. At a first time 206 the digital alert signal 202 is asserted to indicate that the received signal power exceeds the pre-programmed threshold. In response, the wide-band AGC system 108 waits for the pre-programmed delay time 204 before taking further action. The wide-band AGC system 108 continues to monitor the alert signal 202, and when the alert signal has been asserted for longer than the pre-programmed delay time 204, the wide-band AGC system 108 transfers the receiver gain control to itself and begins decreasing the front-end gain of the receiver 102. Preferably, the decrease in gain is done in a plurality of gain steps of a pre-programmed size 208 (e.g., 3 dB) applied at a pre-programmed rate (set by update interval 210) that is substantially faster (e.g., five to ten times faster) than the AGC update rate (set by update interval 222) of the on-channel AGC system 110.

When the front-end gain has been reduced enough to move the received signal power below the pre-programmed threshold, thereby de-asserting the digital alert signal at a second time 218, the wide-band AGC system 108 stops decreasing the front-end gain and cooperates with the on-channel AGC system 110 to return the receiver gain control to the on-channel AGC system 110. During a pre-programmed follow-up time period 212 that starts at the second time 218, the wide-band AGC system 108 limits any gain changes made by the on-channel AGC system 110 to a pre-programmed maximum gain change 214 for each AGC update. Should the alert signal be reasserted at a third time 220, after a delay time 216 the wide-band AGC system 108 will again transfer the receiver gain control to itself, and the process will repeat. It will be appreciated that the delay times 204 and 216 can be set to different pre-programmed values. Preferably, the delay time is set to a first pre-programmed value during the follow-up time period 212 and to a second pre-programmed value at times outside of the follow-up time period 212. The delay time provides an added degree of stability to the wireless communication device 100.

Figure 3:
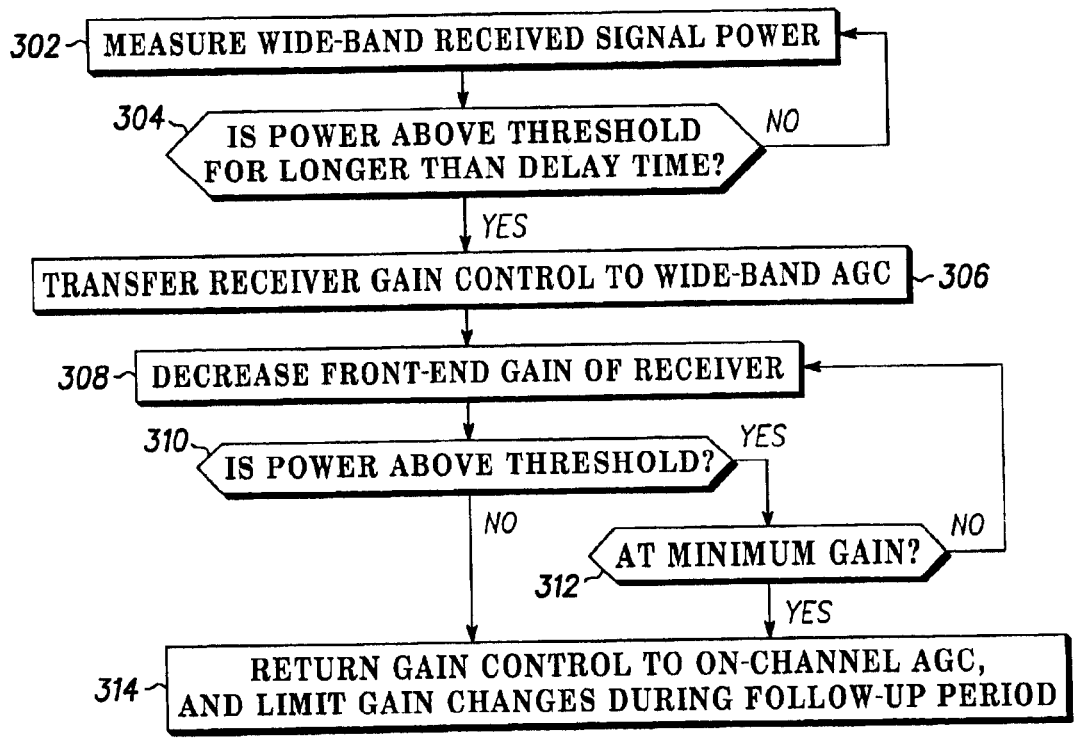
FIG. 3 is a flow diagram in accordance with the present invention.

Referring to FIG. 3, a flow diagram 300 depicts an exemplary method of operation of the apparatus 104 in accordance with the present invention. The flow begins with the power measurement element 106 measuring 302 the wide-band received signal power. The wide-band AGC system 108 then monitors the output 112 of the power measurement element 106 to determine 304 whether the wide-band received signal power has exceeded a pre-programmed threshold for longer than a pre-programmed delay time. If not, the monitoring continues. If so, the wide-band AGC system 108 transfers 306 the receiver gain control to itself and begins decreasing 308 the front-end gain of the receiver 102 through a plurality of gain steps of pre-programmed size applied at a pre-programmed rate, as disclosed herein above.

The wide-band AGC system 108 then checks 310 whether the wide-band received signal power is still above the pre-programmed threshold. If not, the wide-band AGC system 108 returns 314 the receiver gain control to the on-channel AGC system 110 and cooperates with the on-channel AGC system 110 to limit the gain changes made during a follow-up time period, as disclosed herein above. If, on the other hand, at step 310 the power is still above the threshold, the wide-band AGC system 108 checks 312 whether the receiver 102 is at minimum gain. If not, the flow returns to step 308 to continue decreasing the gain. If so, the flow moves to step 314 to return gain control to the on-channel AGC system 110.

Thus, it should be clear from the preceding disclosure that the present invention provides a method and apparatus for mitigating a received power overload. The method and apparatus advantageously is able to respond quickly to a sudden, large increase in signal strength, such as can occur during channel scanning, without causing the receiver to become unstable.

Many modifications and variations of the present invention are possible in light of the above teachings. Thus, it is to be understood that, within the scope of the appended claims, the invention can be practiced other than as described herein above.

What is claimed is:

1. A method in a wireless communication device having a receiver, the method for mitigating a received power overload by transferring control of a receiver gain from an on-channel AGC system to a wide-band AGC system, in response to a large increase in a wide-band received signal power, the method comprising the steps of:

measuring the wide-band received signal power;

transferring receiver gain control from the on-channel AGC system to the wide-band AGC system, when the wide-band received signal power exceeds a pre-programmed threshold for longer than a pre-programmed delay time; and decreasing, by the wide-band AGC system after the transferring step, a front-end gain of the receiver through a plurality of gain steps of a pre-programmed size applied at a pre-programmed rate until the received wide-band signal power falls below the pre-programmed threshold.

2. The method of claim 1, wherein the measuring step comprises the step of measuring the wide-band received signal power in an analog sum of squares detector.

3. The method of claim 1, wherein the decreasing step comprises the step of decreasing the front-end gain of the receiver through a plurality of gain steps of a pre-programmed size applied at a pre-programmed rate that is substantially faster than an AGC update rate of the on-channel AGC system.

4. The method of claim 1, further comprising the step of terminating the decreasing step when the front-end gain reaches a predetermined minimum value.

5. The method of claim 1, further comprising, after the decreasing step has completed, the steps of:

returning receiver gain control to the on-channel AGC system; and limiting, during a pre-programmed follow-up time period, changes in the front end gain of the receiver by the on-channel AGC system to a pre-programmed maximum gain change per AGC update.

6. The method of claim 5, further comprising the steps of:

setting the delay time to a first pre-programmed value during the follow-up time period; and setting the delay time to a second pre-programmed value at times outside of the follow-up time period.

7. An apparatus for use in a wireless communication device having a receiver, the apparatus for mitigating a received power overload by transferring control of a receiver gain from an on-channel AGC system to a wide-band AGC system, in response to a large increase in a wide-band received signal power, the apparatus comprising:

a power measurement element for measuring the wide-band received signal power;

the wide-band AGC system, coupled to the power measurement element, for transferring receiver gain control from the on-channel AGC system to the wide-band AGC system, when the wide-band received signal power exceeds a pre-programmed threshold for longer than a pre-programmed delay time; and the on-channel AGC system, coupled to the wide-band AGC system for cooperating therewith to control the receiver gain, wherein the wide-band AGC system is arranged and programmed to decrease a front-end gain of the receiver through a plurality of gain steps of a pre-programmed size applied at a pre-programmed rate until the received wide-band signal power falls below the pre-programmed threshold.

8. The apparatus of claim 7, wherein the power measurement element comprises an analog sum of squares detector.

9. The apparatus of claim 7, wherein the wide-band AGC system is further arranged and programmed to decrease the front-end gain of the receiver through a plurality of gain steps of a pre-programmed size applied at a pre-programmed rate that is substantially faster than an AGC update rate of the on-channel AGC system.

10. The apparatus of claim 7, wherein the wide-band AGC system is further arranged and programmed to stop decreasing the front-end gain of the receiver when the front-end gain reaches a predetermined minimum value.

11. The apparatus of claim 7, wherein the wide-band AGC system is further arranged and programmed to cooperate with the on-channel AGC system to return receiver gain control to the on-channel AGC system, and to limit, during a pre-programmed follow-up time period, changes in the front end gain of the receiver by the on-channel AGC system to a pre-programmed maximum gain change per AGC update.

12. The apparatus of claim 11, wherein the wide-band AGC system is further arranged and programmed to set the delay time to a first pre-programmed value during the follow-up time period, and to set the delay time to a second pre-programmed value at times outside of the follow-up time period.

13. A wireless communication device, comprising:

a receiver for receiving a wireless communication signal; and an apparatus coupled to the receiver for mitigating a received power overload by transferring control of a receiver gain from an on-channel AGC system to a wide-band AGC system, in response to a large increase in a wide-band received signal power, the apparatus comprising:

a power measurement element for measuring the wide-band received signal power;

the wide-band AGC system, coupled to the power measurement element, for transferring receiver gain control from the on-channel AGC system to the wide-band AGC system, when the wide-band received signal power exceeds a pre-programmed threshold for longer than a pre-programmed delay time; and the on-channel AGC system, coupled to the wide-band AGC system for cooperating therewith to control the receiver gain, wherein the wide-band AGC system is arranged and programmed to decrease a front-end gain of the receiver through a plurality of gain steps of a pre-programmed size applied at a pre-programmed rate until the received wide-band signal power falls below the pre-programmed threshold.

14. The wireless communication device of claim 13, wherein the power measurement element comprises an analog sum of squares detector.

15. The wireless communication device of claim 13, wherein the wide-band AGC system is further arranged and programmed to decrease the front-end gain of the receiver through a plurality of gain steps of a pre-programmed size applied at a pre-programmed rate that is substantially faster than an AGC update rate of the on-channel AGC system.

16. The wireless communication device of claim 13, wherein the wide-band AGC system is further arranged and programmed to stop decreasing the front-end gain of the receiver when the front-end gain reaches a predetermined minimum value.

17. The wireless communication device of claim 13, wherein the wide-band AGC system is further arranged and programmed to cooperate with the on-channel AGC system to return receiver gain control to the on-channel AGC system, and to limit, during a pre-programmed follow-up time period, changes in the front end gain of the receiver by the on-channel AGC system to a pre-programmed maximum gain change per AGC update.

18. The wireless communication device of claim 17, wherein the wide-band AGC system is further arranged and programmed to set the delay time to a first pre-programmed value during the follow-up time period, and to set the delay time to a second pre-programmed value at times outside of the follow-up time period.

* * * * *